United States Patent [19]

Vilkinofsky et al.

[11] Patent Number: 6,008,585
[45] Date of Patent: Dec. 28, 1999

[54] APPARATUS AND METHOD FOR PREVENTING FROM A SHORT LOAD EXCESSIVE CURRENT FLOW THROUGH A FIELD EFFECT TRANSISTOR THAT DELIVERS CURRENT TO A DAYTIME RUNNING LIGHT ON A VEHICLE

[75] Inventors: John W. Vilkinofsky, Columbus, Ohio; Shinichi Kubozuka, Ota, Japan; Yasunobu Onozato, Kiryu, Japan; Kiyohumi Nakayama, Azuma-mura, Japan

[73] Assignees: Honda Giken Kogyo Kabushiki Kaisha; Mitsuba Corporation, both of Japan

[21] Appl. No.: 09/163,923

[22] Filed: Sep. 30, 1998

[51] Int. Cl.$^6$ ................................................. H05B 37/00
[52] U.S. Cl. .................. 315/82; 315/DIG. 7; 307/10.8
[58] Field of Search .................. 315/76, 82, 83, 315/77, DIG. 7, 80; 307/10.1, 10.8

[56] References Cited

U.S. PATENT DOCUMENTS

| | | |
|---|---|---|
| 4,360,852 | 11/1982 | Gilmore . |
| 4,595,966 | 6/1986 | Huber et al. . |
| 4,750,079 | 6/1988 | Fay et al. . |
| 4,800,331 | 1/1989 | Vesce et al. . |
| 4,926,283 | 5/1990 | Qualich . |
| 5,272,392 | 12/1993 | Wong et al. . |
| 5,383,083 | 1/1995 | Shinoda et al. . |
| 5,390,069 | 2/1995 | Marshall . |
| 5,438,237 | 8/1995 | Mullins et al. . |
| 5,694,282 | 12/1997 | Yockey . |

*Primary Examiner*—David H. Vu
*Attorney, Agent, or Firm*—Monica H. Choi

[57] ABSTRACT

A protection circuit prevents, from a short load, excessive current flow through a field effect transistor that delivers current to a daytime running light on a vehicle. The present invention uses commonly available devices, such as resistors and transistors, and a low number of such devices for low cost. Furthermore, the present invention includes a latching circuit for maintaining the switching transistor to be turned off once the current level through the switching transistor reaches an excessive level to prevent the daytime running light from flashing on and off. A voltage, which develops across a resistor that is coupled to the field effect transistor, is an indication of the current level through the field effect transistor. This voltage turns on a first transistor which couples the gate of the field effect transistor to a ground node when the current level through the field effect transistor is greater than a predetermined level. The field effect transistor turns off when the gate of the field effect transistor is coupled to the ground node to prevent excessive current flow through the field effect transistor. A second transistor is configured in a latching configuration with the first transistor to maintain the first transistor to be turned on once the current level through the field effect transistor is greater than a predetermined level and until the power source is reapplied to the field effect transistor.

19 Claims, 2 Drawing Sheets

APPARATUS AND METHOD FOR PREVENTING FROM A SHORT LOAD EXCESSIVE CURRENT FLOW THROUGH A FIELD EFFECT TRANSISTOR THAT DELIVERS CURRENT TO A DAYTIME RUNNING LIGHT ON A VEHICLE

TECHNICAL FIELD

This invention relates to circuits for controlling daytime running lights on vehicles, and more particularly to a circuit for preventing from a short load excessive current flow through a field effect transistor that delivers current to a daytime running light on a vehicle.

BACKGROUND OF THE INVENTION

Daytime running lights augment vehicle safety by enhancing the visibility of a vehicle having daytime running lights. Thus, daytime running lights are becoming a more common feature on vehicles. Because of the recognized importance of daytime running lights on vehicles, Canada has legislated to require daytime running lights on vehicles that are sold in Canada.

In daytime running lights on a vehicle, a high-power output switching transistor delivers current to a high wattage daytime running light bulb filament on the vehicle. Referring to FIG. 1, a high-power MOSFET (Metal Oxide Semiconductor Field Effect Transistor) 102 is used to deliver current from a power source 104 to the filament of a daytime running light 106. The intensity (and thus the brightness) of the daytime running light is determined by the duty cycle of a switched DC voltage, from a voltage switching circuit 108, applied to the gate of the MOSFET 102.

The MOSFET 102 is shown as an example field effect switching device. A field effect transistor is preferred as the switching device rather than a BJT (Bipolar Junction Transistor) because of the higher switching speed and lower resistance of a field effect transistor when the field effect transistor is turned on.

The power source 104 is typically from a battery system of the vehicle, and the battery system includes a fuse which blows and open-circuits the drain of the MOSFET 102 from the power source 104 when excessive current flows though such a fuse. However, a partial short load 110 may be coupled to the source of the MOSFET 102. The partial short load 110 has an impedance which is not low enough to blow the fuse of the battery system. Nevertheless, the impedance of the partial short load 110 may be low enough to cause high current to flow through the switching MOSFET 102. Such high current flowing through the switching MOSFET 102 results in damage to the switching MOSFET 102.

Prior art protection circuits prevent damage to a field effect switching transistor from a short load. However, the prior art protection circuits use relatively complicated circuitry having relatively numerous components. Such complicated circuitry may add higher costs and higher possibility of malfunction if one of the components were to become inoperative. For example, U.S. Pat. No. 4,750,079 to Fay et al. uses digital circuitry to remove an enable signal from a MOSFET, U.S. Pat. No. 5,272,392 to Wong et al. uses a feedback mechanism to maintain a constant level of current through a MOSFET, U.S. Pat. No. 5,390,069 to Marshall uses a current mirror in a protection circuit for limiting current through a MOSFET, and U.S. Pat. No. 5,694,282 to Yockey uses a microprocessor for limiting current through a MOSFET.

In addition, the prior art protection circuits, including U.S. Pat. No. 4,595,966 to Huber et al. and U.S. Pat. No. 5,438,237 to Mullins et al., do not include a latching circuit to keep the switching transistor 102 turned off once the current through the switching transistor 102 reaches an excessive level. Without the latching circuit, the daytime running light may flash on and off as the current through the switching transistor alternately increases and decreases from the mechanism of the prior art protection circuit. Such flashing on and off of the daytime running light may be a traffic hazard on the road and also may cause further degradation of the switching transistor 102.

SUMMARY OF THE INVENTION

Accordingly, in light of these disadvantages of the prior art protection circuit, the present invention is a simpler and lower cost mechanism for preventing, from a short load, excessive current flow through a field effect transistor that delivers current to a daytime running light on a vehicle. The present invention uses low cost devices and relatively low number of devices. Furthermore, the present invention includes a latching circuit for maintaining the switching transistor to be turned off once the current level through the switching transistor reaches an excessive level.

In a general aspect, the present invention is a circuit for preventing, from a short load on a field effect transistor, excessive current flow through the field effect transistor. The field effect transistor drives a daytime running light on a vehicle by conducting current from a power source to the daytime running light. The present invention includes a first transistor, coupled between a gate of the field effect transistor and a ground node, that turns on to couple the gate of the field effect transistor to the ground node when current level through the field effect transistor is greater than a predetermined level. The field effect transistor turns off when the gate of the field effect transistor is thus coupled to the ground node. The present invention also includes a second transistor, coupled to the first transistor, for maintaining the first transistor to be turned on once the current level through the field effect transistor is greater than the predetermined level and until the power source is reapplied to the field effect transistor. In addition, the present invention includes a current detecting resistor, coupled in series with a conductive path of a drain and a source of the field effect transistor, for detecting the current level through the field effect transistor. The current detecting resistor is coupled to the first transistor and the second transistor, and a voltage across the current detecting resistor turns on the first transistor and the second transistor when the current level through the field effect transistor is greater than the predetermined level.

The present invention may be used to particular advantage when the first transistor is a NPN BJT (Bipolar Junction Transistor) and when the second transistor is a PNP BJT (Bipolar Junction Transistor). The NPN BJT and the PNP BJT are coupled in a latching configuration for the latching circuit.

In this manner, the protection circuit of the present invention which prevents, from a short load, excessive current flow through the field effect transistor that delivers current to a daytime running light on a vehicle, uses few transistors and a resistor. By using such a few simple devices, the present invention is advantageous for a low cost and robust protection circuit.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1 and 2 refer to elements having similar structure and function.

DETAILED DESCRIPTION

Figure 1:
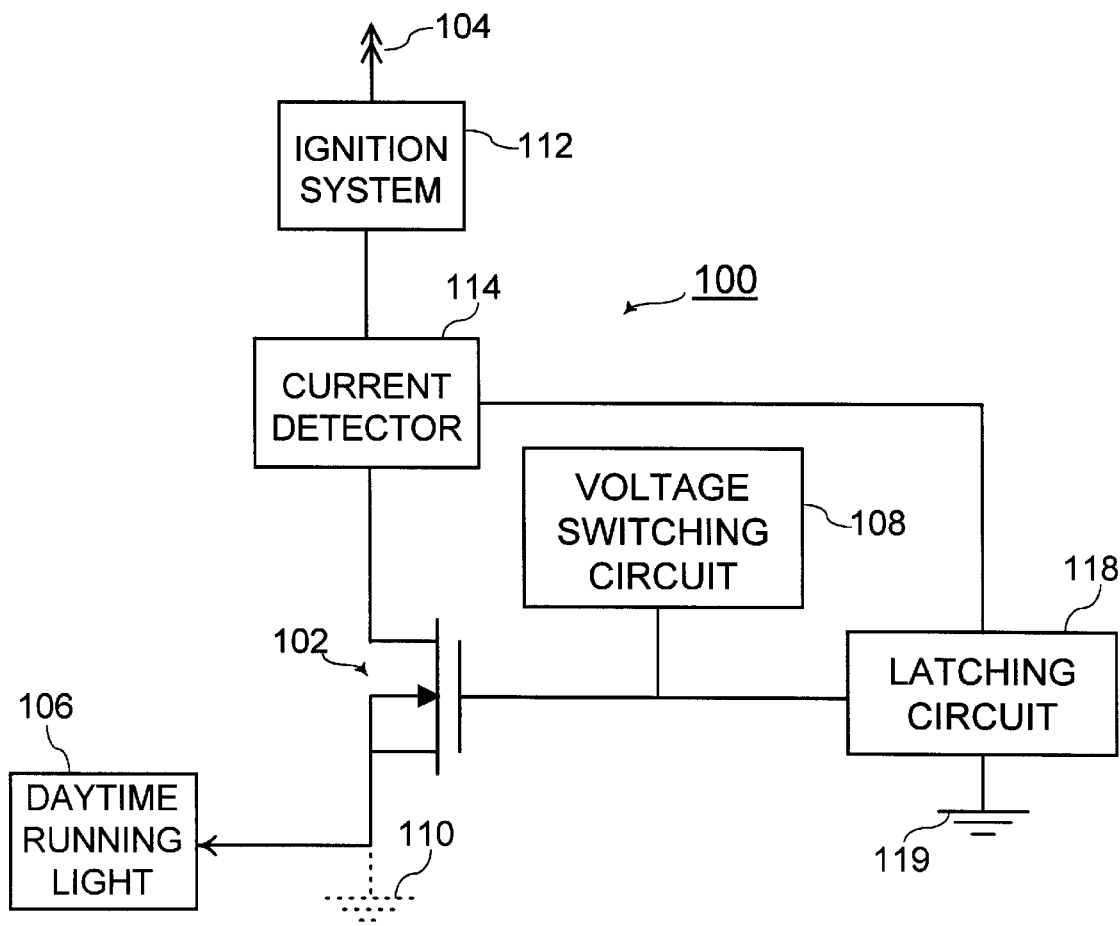
FIG. 1 shows a block diagram of the protection circuit of the present invention.

Referring to FIG. 1, a protection circuit 100 of the present invention prevents, from a short load 110 on the switching MOSFET 102, excessive current flow through the MOSFET 102. The MOSFET 102 drives the daytime running light 106 on a vehicle by conducting current from the power source 104 to the daytime running light 106. An ignition system 112 on such a vehicle couples the power source 104 to the MOSFET 102 when the ignition system 112 is switched on. The power source 104 is from a battery system of such a vehicle.

The protection circuit 100 of the present invention also includes a current detector 114 coupled in the conductive path of the drain and source terminals of the MOSFET 102. The current detector 114 detects the current level flowing through the MOSFET 102. When a short load 110 is coupled to the MOSFET 102, the current detector 114 detects an excessive level of current flowing through the MOSFET 102.

The protection circuit 100 further includes a latching circuit 118. When the current detector 114 detects a current level through the MOSFET 102 that is greater than a predetermined level, the latching circuit 118 couples the gate of the MOSFET 102 to a ground node 119. Such coupling of the gate of the MOSFET 102 to the ground node 119 causes the MOSFET 102 to turn off to prevent excessive current flow through the MOSFET 102. In addition, the latching circuit 118 maintains the coupling of the gate of the MOSFET 102 to the ground node 119 once the current level through is MOSFET 102 is detected to be greater than the predetermined level.

Figure 2:
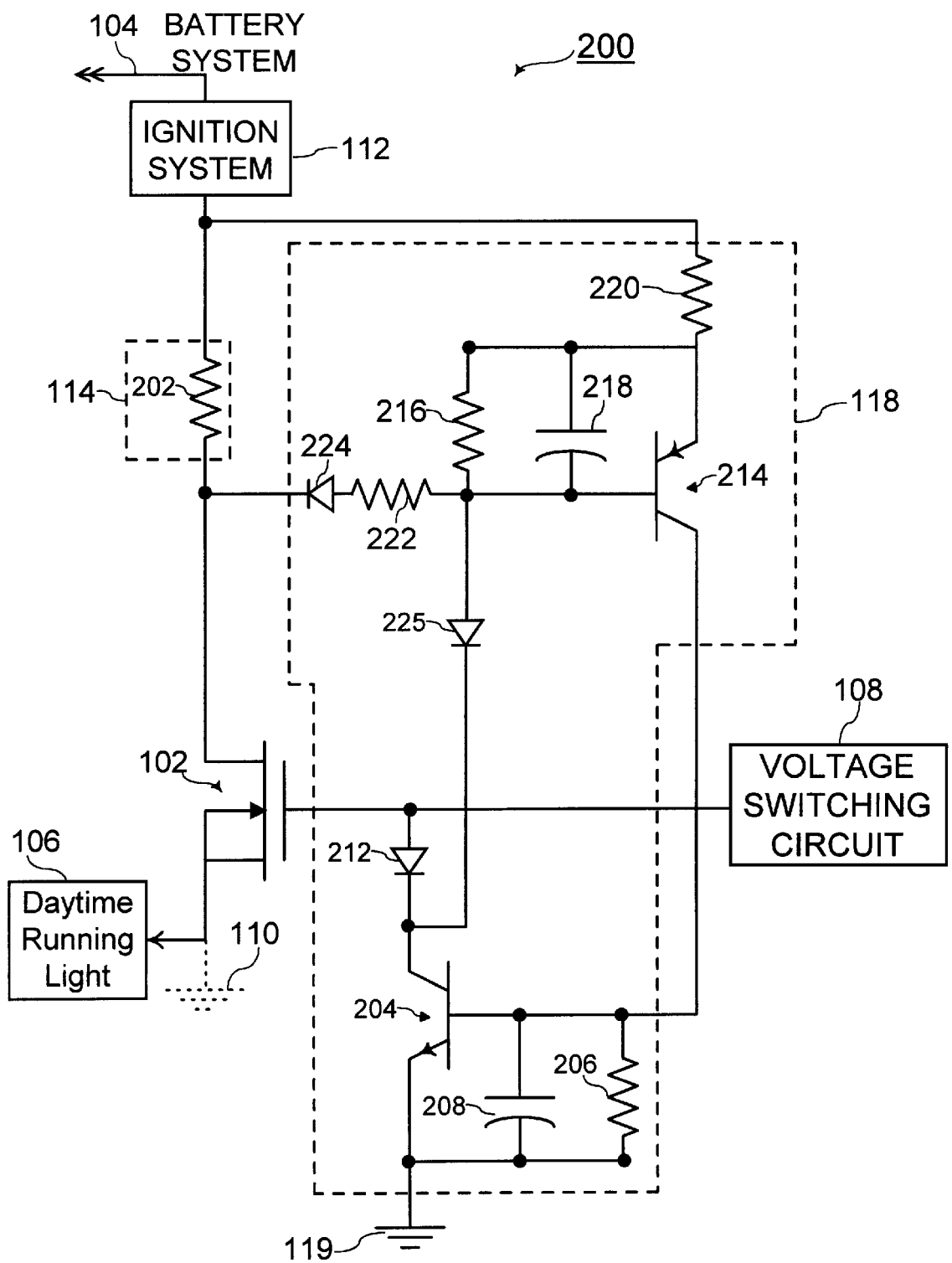
FIG. 2 shows an implementation of the block diagram of FIG. 1, according to an embodiment of the present invention.

Referring to FIG. 2, an example implementation 200 of the protection circuit 100 of FIG. 1 according to the present invention uses relatively few simple devices for lower cost. Referring to FIGS. 1 and 2, the current detector 114 is a current detecting resistor 202. The current detecting resistor 202 may be implemented in any way known to one of ordinary skill in the art for implementing resistance.

Referring to FIGS. 1 and 2, the latching circuit 118 (shown within dashed lines) is comprised of an NPN BJT (Bipolar Junction Transistor) 204. A first resistor 206 and a first capacitor 208 are coupled between the base and the emitter of the NPN BJT 204. The emitter of the NPN BJT 204 is coupled to the ground node 119. The collector of the NPN BJT 204 is coupled to the gate of the MOSFET 102 via a first diode 212.

Furthermore, the latching circuit 118 is comprised of a PNP BJT (Bipolar Junction Transistor) 214. The PNP BJT 214 and the NPN BJT 204 are coupled in a latching configuration. In such a configuration, the collector of the PNP BJT 214 is coupled to the base of the NPN BJT 204. A second resistor 216 and a second capacitor 218 are coupled between the base and the emitter of the PNP BJT 214. The current detecting resistor 202 is coupled to the emitter of the PNP BJT 214 through a third resistor 220 and is coupled to the base of the PNP BJT 214 through a fourth resistor 222 and a second diode 224. The base of the PNP BJT 214 is connected to the collector of the NPN BJT 204 through a third diode 225.

The example implementation 200 of the protection circuit 100 of FIG. 1 operates in the following manner. Referring to FIG. 2, if a short load 110 is coupled to the switching MOSFET 102, a high level of current initially flows through the MOSFET 102. The current flowing through the drain and source of the MOSFET 102 also flows through the current detecting resistor 202. A higher voltage develops across the current detecting resistor 202 when a corresponding higher current flows through the current detecting resistor 202.

The current detecting resistor 202 is coupled between the base and emitter of the PNP BJT 214. When the current level through the MOSFET 102 is greater than a predetermined level, the voltage developed across the current detecting resistor 202 is sufficient to turn on the PNP BJT 214.

When the PNP BJT 214 turns on, the current flowing through the PNP BJT 214 charges up the base of the NPN BJT 204. Thus, the NPN BJT 204 also turns on. The NPN BJT 204, when turned on, couples the gate of the MOSFET 102 to the ground node 119. With the gate of the MOSFET 102 shorted to the ground node 119, the MOSFET 102 turns off such that excessive current does not flow through the MOSFET 102.

In this manner, the protection circuit 200 of the present invention prevents excessive current flow through the MOSFET 102 when a short load 110 is coupled to the MOSFET 102. The gate of the MOSFET 102 is grounded via the NPN BJT 204 when the current level through the MOSFET 102 is greater than a predetermined level. The present invention uses few simple commonly available devices such as a resistor for the current detector 114 and two bipolar junction transistors 204 and 214 for preventing, from a short load 110 on the switching MOSFET 102, excessive current flow through the MOSFET 102. Thus, the present invention is advantageous for a low-cost protection circuit.

Because the PNP BJT 214 and the NPN BJT 204 are coupled in a latching configuration, when PNP BJT 214 turns on and conducts current, the base of the NPN BJT 204 charges up to a higher voltage such that the NPN BJT 204 conducts more current. In turn, when the NPN BJT 204 conducts more current, the base of the PNP BJT 214 discharges down to a lower voltage because the base of the PNP BJT 214 is connected to the collector of the NPN BJT 204 through the third diode 225. Thus, when the NPN BJT 204 conducts more current, the PNP BJT 214 also conducts more current.

In this manner, the NPN BJT 204 and the PNP BJT 214 within a latching configuration maintain each other to be turned on once the current level through the MOSFET 102 is greater than the predetermined level. The NPN BJT 204 is maintained to be turned on until the power source 104 from the battery system of the vehicle is removed and then reapplied to the MOSFET 102 through the ignition system 112 of the vehicle and until the current level through the MOSFET 102 decreases back to below the predetermined level. Alternatively, the power source 102 from the battery system of the vehicle may be removed and then reapplied to the MOSFET 102 by disconnecting and then reconnecting the battery system from the MOSFET 102 via other mechanisms known to one of ordinary skill in the art.

Without the latching configuration, the daytime running light may flash on and off as the current through the switching transistor alternately increases and decreases from the mechanism of the prior art protection circuit. Such flashing on and off of the daytime running light may be a traffic hazard on the road and also causes further degradation of the MOSFET 102. The latching configuration of the NPN BJT 204 and PNP BJT 214 prevents such flashing on and off of the daytime running light.

The foregoing is by way of example only and is not intended to be limiting. For example, the advantageous features of the present invention may be implemented with other types of simple and commonly available transistors aside from the examples of the BJTs 204 and 214 for the latching circuit 118. Therefore, the present invention is limited only as defined in the following claims and equivalents thereof

We claim:

1. A protection circuit for preventing, from a short load on a field effect transistor, excessive current flow through the field effect transistor, the field effect transistor driving a daytime running light on a vehicle by conducting current from a power source to the daytime running light, the circuit comprising:
    a first transistor, coupled between a gate of the field effect transistor and a ground node, that turns on to couple the gate of the field effect transistor to the ground node when current level through the field effect transistor is greater than a predetermined level, wherein the field effect transistor turns off when the gate of the field effect transistor is coupled to the ground node;
    a second transistor, coupled to the first transistor, for maintaining the first transistor on once the current level through the field effect transistor is greater than the predetermined level and until the power source is reapplied to the field effect transistor; and
    a current detecting resistor, coupled in series with a conductive path of a drain and a source of the field effect transistor, for detecting the current level through the field effect transistor, the current detecting resistor being coupled to the first transistor and the second transistor, wherein a voltage across the current detecting resistor turns on the first transistor and the second transistor when the current level through the field effect transistor is greater than the predetermined level.

2. The protection circuit of claim 1, wherein the current detecting resistor is coupled between the power source and the drain of the field effect transistor.

3. The protection circuit of claim 1, wherein the power source is reapplied to the field effect transistor from an ignition system of the vehicle.

4. The protection circuit of claim 1, wherein the first transistor is an NPN BJT (Bipolar Junction Transistor) having a first collector and a first emitter, and wherein the first collector is coupled to the gate of the field effect transistor and wherein the first emitter is coupled to the ground node.

5. The protection circuit of claim 4, wherein the second transistor is a PNP BJT (Bipolar Junction Transistor) having a base and an emitter, and wherein the current detecting resistor is coupled between the base and the emitter of the PNP BJT.

6. The protection circuit of claim 5, wherein the NPN BJT and the PNP BJT are coupled in a latching configuration.

7. The protection circuit of claim 1, wherein the second transistor is a PNP BJT (Bipolar Junction Transistor) having a base and an emitter, and wherein the current detecting resistor is coupled between the base and the emitter of the PNP BJT.

8. A protection circuit for preventing, from a short load on a MOSFET (Metal Oxide Semiconductor Field Effect Transistor), excessive current flow through the MOSFET, the MOSFET driving a daytime running light on a vehicle by conducting current from a power source to the daytime running light, the circuit comprising:
    a NPN BJT (Bipolar Junction Transistor), having a first collector coupled to a gate of the MOSFET and having a first emitter coupled to a ground node, wherein the NPN BJT turns on to couple the gate of the MOSFET to the ground node when current level through the MOSFET is greater than a predetermined level, and wherein the MOSFET turns off when the gate of the MOSFET is coupled to the ground node;
    a PNP BJT (Bipolar Junction Transistor), having a collector coupled to a first base of the NPN BJT and having a base coupled to the first collector of the NPN BJT, for maintaining the NPN BJT on once the current level through the MOSFET is greater than the predetermined level and until the power source is reapplied from an ignition system of the vehicle; and
    a current detecting resistor, coupled between the power source and a drain of the MOSFET, for detecting the current level through the MOSFET, the current detecting resistor being coupled between the emitter of the PNP BJT and the base of the PNP BJT, wherein a voltage across the current detecting resistor turns on the PNP BJT and the NPN BJT when the current level through the MOSFET is greater than the predetermined level.

9. A daytime running light system on a vehicle, the daytime running light system comprising:
    a daytime running light bulb;
    a battery system;
    a field effect transistor coupled between the battery system and the daytime running light bulb, that turns on to couple the battery system to the daytime running light bulb; and
    a protection circuit for preventing, from a short load on the field effect transistor, excessive current flow through the field effect transistor, the short load protection circuit comprising:
        a first transistor, coupled between a gate of the field effect transistor and a ground node, that turns on to couple the gate of the field effect transistor to the ground node when current level through the field effect transistor is greater than a predetermined level, wherein the field effect transistor turns off when the gate of the field effect transistor is coupled to the ground node;
        a second transistor, coupled to the first transistor, for maintaining the first transistor on once the current level through the field effect transistor is greater than the predetermined level and until the power source is reapplied to the field effect transistor; and
        a current detecting resistor, coupled in series with a conductive path of a drain and a source of the field effect transistor, for detecting the current level through the field effect transistor, the current detecting resistor being coupled to the first transistor and the second transistor, wherein a voltage across the current detecting resistor turns on the first transistor and the second transistor when the current level through the field effect transistor is greater than the predetermined level.

10. The daytime running light system of claim 9, further including:

an ignition system for coupling the battery system to the field effect transistor and to the protection circuit when the ignition system is turned on.

11. The daytime running light system of claim 9, wherein the current detecting resistor is coupled between the power source and the drain of the field effect transistor.

12. The daytime running light system of claim 9, wherein the first transistor is an NPN BJT (Bipolar Junction Transistor) having a first collector and a first emitter, and wherein the first collector is coupled to the gate of the field effect transistor and wherein the first emitter is coupled to the ground node.

13. The daytime running light system of claim 12, wherein the second transistor is a PNP BJT (Bipolar Junction Transistor) having a base and an emitter, and wherein the current detecting resistor is coupled between the base and the emitter of the PNP BJT.

14. The daytime running light system of claim 13, wherein the NPN BJT and the PNP BJT are coupled in a latching configuration.

15. A protection circuit for preventing, from a short load on a field effect transistor, excessive current flow through the field effect transistor, the field effect transistor driving a daytime running light on a vehicle by conducting current from a power source to the daytime running light, the circuit comprising:

means for coupling a ground node to a gate of the field effect transistor when current level through the field effect transistor is greater than a predetermined level, such that the voltage across the current detecting resistor turns on the first transistor and the second transistor when the current level through the field effect transistor is greater than the predetermined level, wherein the field effect transistor turns off when the gate of the field effect transistor is coupled to the ground node;

means for maintaining coupling of the gate of the field effect transistor to the ground node once the current level through the field effect transistor is greater than the predetermined level and until the power source is reapplied to the field effect transistor; and means for detecting the current level through the field effect transistor to generate a voltage when the current level through the field effect transistor is greater than the predetermined level, wherein said voltage controls the means for coupling to couple the ground node to the gate of the field effect transistor, and wherein said voltage controls the means for maintaining to maintain the coupling of the gate of the field effect transistor to the ground node until the power source is reapplied to the field effect transistor.

16. A method for preventing, from a short load on a field effect transistor, excessive current flow through the field effect transistor, the field effect transistor driving a daytime running light on a vehicle by conducting current from a power source to the daytime running light, the method including the steps of:

detecting a voltage, across a current detecting resistor coupled to a drain of the field effect transistor, as an indication of current level through the field effect transistor;

grounding a gate of the field effect transistor when the current level through the field effect transistor is greater than a predetermined level by turning on a first transistor coupled between the gate of the field effect transistor and a ground node; and maintaining the first transistor on by latching the first transistor with a second transistor once the current level through the field effect transistor is greater than the predetermined level and until the power source is reapplied to the field effect transistor, and wherein the second transistor is coupled to the current detecting resistor such that the voltage across the current detecting resistor turns on the first transistor and the second transistor when the current level through the field effect transistor is greater than the predetermined level.

17. The method of claim 16, wherein the first transistor is an NPN BJT (Bipolar Junction Transistor) having a first collector and a first emitter, and wherein the first collector is coupled to the gate of the field effect transistor and wherein the first emitter is coupled to the ground node.

18. The method of claim 17, wherein the second transistor is a PNP BJT (Bipolar Junction Transistor) having a base and an emitter, and wherein the current detecting resistor is coupled between the base and the emitter of the PNP BJT.

19. The method of claim 18, wherein the NPN BJT and the PNP BJT are coupled in a latching configuration.

* * * * *